United States Patent
Colson et al.

[11] Patent Number: 6,112,797
[45] Date of Patent: *Sep. 5, 2000

[54] APPARATUS FOR FABRICATING A LIGHT CONTROL WINDOW COVERING

[75] Inventors: Wendell B. Colson; Paul G. Swiszcz, both of Boulder, Colo.

[73] Assignee: Hunter Douglas Inc., Upper Saddle River, N.J.

[ * ] Notice: This patent is subject to a terminal disclaimer.

[21] Appl. No.: 09/020,736

[22] Filed: Feb. 9, 1998

Related U.S. Application Data

[60] Continuation of application No. 08/485,051, Jun. 7, 1995, Pat. No. 5,718,799, which is a division of application No. 08/243,000, May 16, 1994, Pat. No. 6,001,199, which is a continuation of application No. 07/867,476, Apr. 13, 1992, abandoned, which is a division of application No. 07/701,165, May 17, 1991, Pat. No. 5,313,999, which is a continuation-in-part of application No. 07/602,999, Oct. 24, 1990, abandoned.

[51] Int. Cl.$^7$ ........................................................ E06B 9/08
[52] U.S. Cl. .................................. 160/121.1; 160/DIG. 7
[58] Field of Search .............................. 160/121.1, 84.01, 160/166.1 R, 89, DIG. 7

[56] References Cited

U.S. PATENT DOCUMENTS

| | | |
|---|---|---|
| Re. 30,254 | 4/1980 | Rasmussen . |
| 286,027 | 10/1883 | Lobdell . |
| 718,992 | 1/1903 | Emery . |
| 1,121,898 | 12/1914 | Davis ..................................... 160/265 |
| 1,764,789 | 6/1930 | Heald . |
| 1,937,342 | 11/1933 | Higbie . |
| 1,958,695 | 5/1934 | Claus . |
| 2,029,675 | 2/1936 | Schlamp . |
| 2,056,823 | 10/1936 | Brown ..................................... 160/133 |
| 2,110,145 | 3/1938 | Loehr . |
| 2,140,049 | 12/1938 | Grauel . |
| 2,267,869 | 12/1941 | Loehr . |
| 2,571,372 | 10/1951 | Martin . |
| 2,620,850 | 12/1952 | Janowski . |

(List continued on next page.)

FOREIGN PATENT DOCUMENTS

| | | |
|---|---|---|
| 249985 | 5/1961 | Australia . |
| 672993 | 3/1966 | Belgium . |
| 2090046 | 2/1993 | Canada . |
| 029442 | 11/1984 | European Pat. Off. . |
| 220074 | 4/1987 | European Pat. Off. . |
| 482793 | 4/1992 | European Pat. Off. . |
| 688935 | 12/1995 | European Pat. Off. . |

(List continued on next page.)

*Primary Examiner*—David M. Purol
*Attorney, Agent, or Firm*—Dorsey & Whitney LLP

[57] ABSTRACT

A fabric light control window covering in which fabric vanes are adhesively bonded between two sheer fabric sheets such that relative movement between the sheer fabric sheets in a direction perpendicular to the longitudinal direction of the fabric vanes changes the angle of the fabric vanes and, thus, controls the amount of light admitted through the shade. The vanes are bonded to the sheer fabric sheets in a manner which tends to bias the sheer fabric sheets together to the nonlight admitting position. Also, disclosed are methods and apparatus for manufacturing the above window covering. The method features linear application of adhesive to the vane material which provides for a uniform appearance in the finished product. A heat setting process and apparatus is disclosed in which the bonded layers of sheer fabrics and vanes are fed between belts over hot and cool surfaces, under uniform tension and pressure. This provides for heat setting of the layers of the window covering to a uniform temperature-size relationship without inducing wrinkles or distortion into the fabric during heat setting.

68 Claims, 8 Drawing Sheets

U.S. PATENT DOCUMENTS

| | | |
|---|---|---|
| 2,620,869 | 12/1952 | Friedman . |
| 2,688,356 | 9/1954 | Conti . |
| 2,822,840 | 2/1958 | Reynolds et al. . |
| 2,834,412 | 5/1958 | Velke . |
| 2,856,324 | 10/1958 | Janowski . |
| 2,865,446 | 12/1958 | Cole . |
| 2,914,122 | 11/1959 | Pinto . |
| 2,994,370 | 8/1961 | Pinto .......................................... 160/89 |
| 3,032,099 | 5/1962 | Croxen . |
| 3,111,163 | 11/1963 | Nelson . |
| 3,125,154 | 3/1964 | Woodle . |
| 3,141,497 | 7/1964 | Griesser .................................. 160/170 |
| 3,170,505 | 2/1965 | Lorentzen et al. ........... 160/178.3 R X |
| 3,299,943 | 1/1967 | Poe ...................................... 160/176.1 |
| 3,371,702 | 3/1968 | Keegan et al. . |
| 3,384,519 | 5/1968 | Froget . |
| 3,386,489 | 6/1968 | Denton et al. ....................... 160/322 X |
| 3,421,276 | 1/1969 | LaBarge . |
| 3,509,934 | 5/1970 | Smart . |
| 3,540,975 | 11/1970 | Wright et al. . |
| 3,661,665 | 5/1972 | Froget . |
| 3,682,752 | 8/1972 | Hunter et al. . |
| 3,701,376 | 10/1972 | Froget . |
| 3,708,009 | 1/1973 | Viol . |
| 3,783,931 | 1/1974 | Assael . |
| 3,844,330 | 10/1974 | Hyman . |
| 3,851,699 | 12/1974 | Shapiro . |
| 3,860,056 | 1/1975 | Bruneau . |
| 3,916,973 | 11/1975 | Schuppler et al. ................ 160/178.3 R |
| 3,946,789 | 3/1976 | Ronkholz-Tolle ............. 160/84.1 C X |
| 3,999,590 | 12/1976 | Koch . |
| 4,009,626 | 3/1977 | Gressman . |
| 4,019,554 | 4/1977 | Rasmussen . |
| 4,039,019 | 8/1977 | Hopper . |
| 4,052,521 | 10/1977 | Ferrari . |
| 4,137,111 | 1/1979 | Hansen . |
| 4,182,088 | 1/1980 | Ball . |
| 4,194,550 | 3/1980 | Hopper . |
| 4,202,395 | 5/1980 | Heck et al. . |
| 4,236,567 | 12/1980 | Frentzel ........................... 160/178.3 R |
| 4,309,472 | 1/1982 | Gotting et al. . |
| 4,332,288 | 6/1982 | Frentzel et al. . |
| 4,335,775 | 6/1982 | Frentzel et al. . |
| 4,344,474 | 8/1982 | Berman . |
| 4,377,431 | 3/1983 | Chodosh . |
| 4,386,454 | 6/1983 | Hopper . |
| 4,397,704 | 8/1983 | Frick . |
| 4,434,834 | 3/1984 | Ennes . |
| 4,450,027 | 5/1984 | Colson . |
| 4,473,101 | 9/1984 | Langeler . |
| 4,475,579 | 10/1984 | Bassett ............................ 160/178.3 R |
| 4,519,434 | 5/1985 | Forquer . |
| 4,535,828 | 8/1985 | Brockhaus . |
| 4,623,012 | 11/1986 | Rude et al. ......................... 160/171 X |
| 4,631,217 | 12/1986 | Anderson . |
| 4,647,488 | 3/1987 | Schnebly . |
| 4,673,018 | 6/1987 | Judkins . |
| 4,685,986 | 8/1987 | Anderson . |
| 4,687,038 | 8/1987 | Clemente . |
| 4,694,543 | 9/1987 | Conley . |
| 4,732,630 | 3/1988 | Schnebly . |
| 4,799,299 | 1/1989 | Campbell . |
| 4,815,581 | 3/1989 | Deutschlander . |
| 4,826,555 | 5/1989 | Long . |
| 4,858,668 | 8/1989 | Toti .................................... 160/84.1 C |
| 4,862,941 | 9/1989 | Colson ............................... 160/84.1 D |
| 4,884,612 | 12/1989 | Schnebly et al. . |
| 4,885,190 | 12/1989 | Schnebly . |
| 4,895,611 | 1/1990 | Bryniarski et al. . |
| 4,909,870 | 3/1990 | Gould et al. . |
| 4,912,900 | 4/1990 | Yeamans . |
| 4,915,153 | 4/1990 | Toti ..................................... 160/345 X |
| 4,928,369 | 5/1990 | Schnebly et al. . |
| 4,948,445 | 8/1990 | Hees . |
| 4,984,617 | 1/1991 | Corey ................................ 160/84.1 D |
| 5,002,628 | 3/1991 | Schnebly . |
| 5,012,552 | 5/1991 | Wulf . |
| 5,070,924 | 12/1991 | Bateman . |
| 5,106,444 | 4/1992 | Corey et al. . |
| 5,193,601 | 3/1993 | Corey ................................ 160/84.1 D |
| 5,228,936 | 7/1993 | Goodhue . |
| 5,287,908 | 2/1994 | Hoffmann et al. . |
| 5,301,733 | 4/1994 | Toti . |
| 5,320,154 | 6/1994 | Colson et al. ....................... 160/121.1 |
| 5,339,882 | 8/1994 | Judkins . |
| 5,339,883 | 8/1994 | Colson et al. . |
| 5,490,553 | 2/1996 | Colson et al. . |
| 5,638,880 | 6/1997 | Colson et al. . |
| 5,664,613 | 9/1997 | Jelic . |

FOREIGN PATENT DOCUMENTS

| | | |
|---|---|---|
| 319458 | 11/1902 | France . |
| 847779 | 10/1939 | France . |
| 1166398 | 11/1958 | France . |
| 1309194 | 10/1962 | France . |
| 1321456 | 2/1963 | France . |
| 1364674 | 5/1964 | France . |
| 1373515 | 8/1964 | France . |
| 1381472 | 11/1964 | France . |
| 1465261 | 11/1966 | France . |
| 1480262 | 4/1967 | France . |
| 1521488 | 3/1968 | France . |
| 1526507 | 4/1968 | France . |
| 1585159 | 1/1970 | France . |
| 2095034 | 2/1972 | France . |
| 2180260 | 11/1973 | France . |
| 2362264 | 3/1978 | France . |
| 2398170 | 2/1979 | France . |
| 122088 | 4/1900 | Germany . |
| 382758 | 10/1923 | Germany . |
| 684202 | 11/1939 | Germany . |
| 1241361 | 7/1964 | Germany . |
| 1942674 | 3/1971 | Germany . |
| 7008554 | 10/1971 | Germany . |
| 2735654 | 2/1979 | Germany . |
| 2923233 | 12/1980 | Germany . |
| 2936811 | 4/1981 | Germany . |
| 3041983 | 9/1982 | Germany . |
| 3525515 | 1/1987 | Germany . |
| 8906284 | 9/1989 | Germany . |
| 51-136344 | 11/1976 | Japan . |
| 6508988 | 1/1967 | Netherlands . |
| 7805464 | 10/1978 | Netherlands . |
| 331432 | 9/1958 | Switzerland . |
| 423207 | 4/1967 | Switzerland . |
| 476482 | 9/1969 | Switzerland . |
| 494338 | 9/1970 | Switzerland . |
| 951484 | 3/1964 | United Kingdom . |
| 1036126 | 7/1966 | United Kingdom . |
| 1116934 | 6/1968 | United Kingdom . |
| 1228677 | 4/1971 | United Kingdom . |
| 1494842 | 12/1977 | United Kingdom . |
| 1506438 | 2/1978 | United Kingdom . |
| WO 8002712 | 12/1980 | WIPO . |
| WO 91/06237 | 5/1991 | WIPO . |

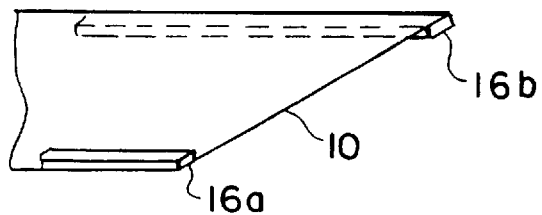
FIG. 4
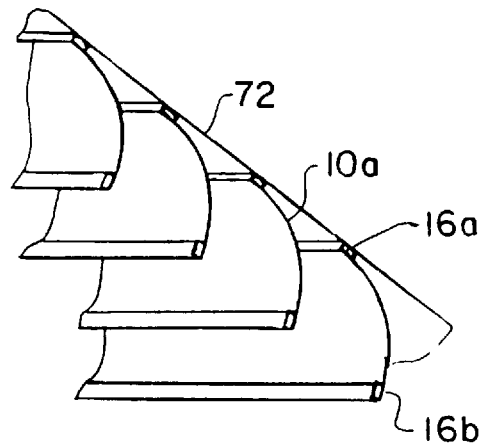
FIG. 5
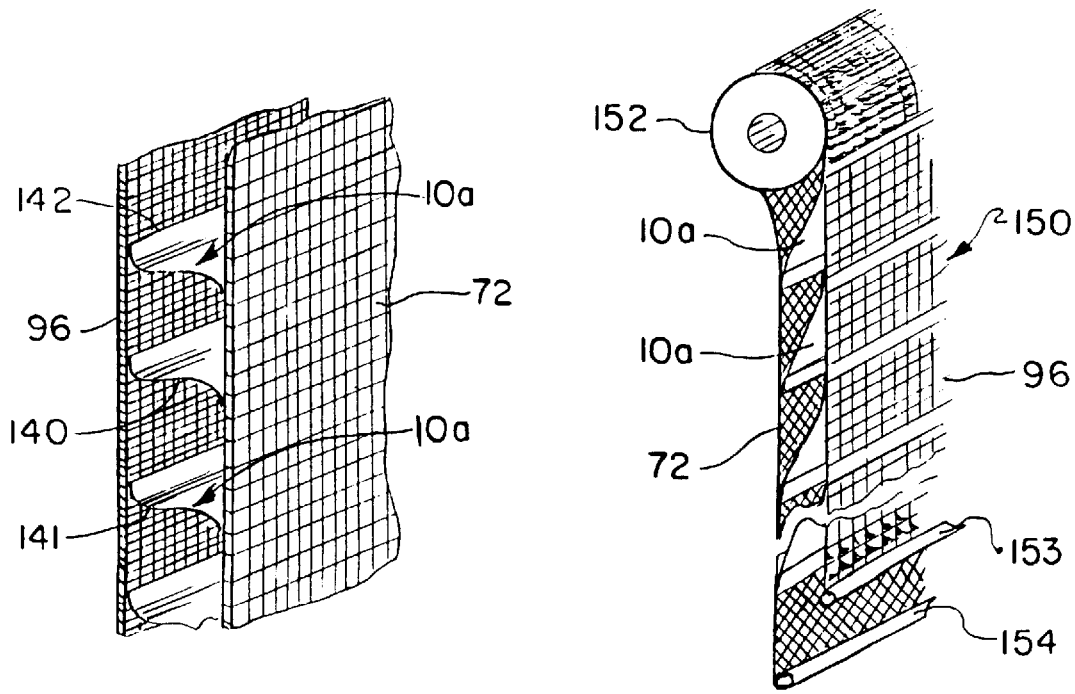
FIG. 6
FIG. 7

APPARATUS FOR FABRICATING A LIGHT CONTROL WINDOW COVERING

CROSS-REFERENCE TO RELATED APPLICATIONS

This application is a continuation of application Ser. No. 08/485,051 filed Jun. 7, 1995, now U.S. Pat. No. 5,718,799 which is a division of application Ser. No. 08/243,000 filed May 16, 1994, now U.S. Pat. No. 6,001,199 which is a continuation of Ser. No. 07/867,476 filed Apr. 13, 1992, abandoned, which is a division of Ser. No. 07/701,165 filed May 17, 1991, now U.S. Pat. No. 5,313,999, which is a continuation-in-part of Ser. No. 07/602,998 filed Oct. 24, 1990, abandoned.

BACKGROUND OF THE INVENTION

The present invention relates to window coverings and, more particularly, to fabric window coverings provided with adjustable vanes for controlling the amount of light passing therethrough. The present invention also includes methods and apparatus for producing such a window covering.

Fabric window coverings are often preferred by consumers for a number of their features. The features most often considered desirable are the softer appearance relative to traditional venetian blinds, the uniform appearance which they provide a window, and the insulating properties associated with cellular fabric shades.

Cellular fabric shades offering these features are known in the art. For example, U.S. Pat. No. 4,450,027 to Colson discloses cellular window coverings which may be made of fabric or film materials. In the process disclosed in the Colson patent, a flexible strip material is folded into a continuous longitudinal tube and the longitudinal folds thus created are permanently set by passing the tubing material around a heat setting wheel.

Adhesive is applied along one side of the flattened tubular material which is subsequently stacked by winding onto a rack having flat surfaces. The winding in this manner presses the adhesive to the next layer wound onto the rack to form a bonded unitary stack of closed tubular cells. When the ends are cut from the rack the stack may be expanded and the permanently set creases provide a neat and uniform outward appearance.

U.S. Pat. No. 4,732,630 to Schnebly discloses a modification to the Colson process described above. In the Schnebly patent a hot-melt adhesive is applied to one side of the tubular material. After the flat tubular strips have been stacked and cut, they are placed in an oven under pressure and the hot-melt adhesive is activated to bond the layers together.

Both of the above patents disclose window coverings which exhibit the desirable features discussed to this point. However, window coverings of that type lack one feature which is often desired by consumers. That feature is the ability to control the amount of light admitted through the window covering, similar to a traditional venetian blind. There have been some attempts to provide a fabric window covering with the ability to control the amount of light entering the room. However, these attempts have lacked one or more of the features discussed above and have been less than successful.

U.S. Pat. No. 3,384,519 to Froget discloses one such attempt. The window covering disclosed therein consists of two cloth layers spaced apart by movable parallel blades having each of their marginal edges heat-welded to one of the movable cloth layers. With this window covering, relative movement of the two cloth layers in a direction perpendicular to the blades changes the angle of the blade and thus controls the amount of light admitted through the article. A number of undesirable features of the Froget window covering derive from the fact that it is constructed utilizing a heat-welding process. First, this limits the fabrics which may be utilized to thermoplastic materials. Also, heat-welding necessarily requires a melting of at least some of the fibers of the materials bonded, thus providing an uneven outer appearance along the heat-welds and producing unwanted crimps or creases in the materials, which can result in fatigue failure. Further, heat-welding is a relatively slow process which may require six or more seconds to create a bond over an extended length. This is too slow for application in high volume commercial production processes. Other drawbacks of the Froget window covering are that heat welds are limited in strength, especially at elevated temperatures experienced by an insulating type shade placed adjacent a sunlit window; and the difficulty in achieving uniformly straight heat welded joints over an extended length.

U.S. Pat. No. 2,865,446 to Cole discloses a window covering in which a long rectangular piece of fabric is doubled back upon itself and a plurality of pleated elements are placed between the folded over sheets. The pleated elements are an accordion-pleated fabric which extends when the two sides of the folded over fabric are moved relative to one another in a direction perpendicular to the accordion pleats. Such a window covering does not provide a uniform appearance because the accordion-pleated fabric located closer to the top of the window covering does not expand to the same extent as the fabric closer to the bottom of the window covering. Also, it is very difficult to ensure that such accordion-pleated fabric returns to its desired position after each expansion.

The construction of Cole inherently creates an undesirable feature if a woven type sheer fabric is used for the folded over, long rectangular piece of fabric. That undesirable feature is a moire effect or interference pattern which would result when light is viewed through the folded over fabric. The Froget window covering would also appear to have this drawback because the embodiment shown in FIG. 8 of that patent appears to show front and back fabrics of the same material.

French Patent No. 1,309,194 discloses a curtain with variable opacity. In this curtain, screen or mesh parallel sides are provided with tiltable braids therebetween. The braids are said to be attached at their edges to the sides, however, no means for attachment is specified. The drawings appear to indicate a hinged type attachment and the specification ends by stating that the difficulties of construction are substantial.

SUMMARY OF THE INVENTION

It is, therefore, an object of the present invention to provide a fabric light control window covering comprising first and second parallel sheer fabric sides and a plurality of opaque or semi-opaque vanes extending between the sheer fabric sides with the vanes being angularly controllable by relative movement of the sheer fabric sides.

Another object of the invention is to provide such a window covering which has a neat and uniform construction and outer appearance in all degrees of light control. In this respect a feature of the present invention is therefore adhesive bonding of the light control vanes to the sheer fabric utilizing linear application of the adhesive and, thus, a high degree of controllability of the adhesive application process and bonding of the vane. Such a feature provides advantages other than simply an improved outward appearance. The precisely uniform construction improves the operation of the blind by preventing warps or distortions from developing over the life of the blind.

Another object of the invention is to provide such a blind which operates with a high degree of repeatability, that is, always returns to the same appearance when closed. Thus, a feature of the present invention is attachment of the vanes to the sheer fabric sides such that the vanes tend to bias the window covering toward the minimum light admitting position. A further feature of the invention in this respect is a novel heat setting of the three layers together in order to provide a uniform and wrinkle-free shade at any temperature in subsequent use. These features allow the window covering to maintain its original shape and appearance even in the presence of temperature extremes encountered in a window environment.

A further object of the present invention is to provide methods and apparatus capable of producing the above window covering. One of the features of the present invention is adhesive bonding by means of adhesive linearly applied on the vane material. Linear application ensures a high degree of accuracy and provides uniform and straight adhesive lines. Another feature of the invention is the unique heat setting process utilizing hot and cold rollers and tension belts or hot and cold flat plates and belts to uniformly press the sandwiched fabrics during reheat setting and thus guarantee a wrinkle-free structure.

It is also an object of the present invention to provide such methods and apparatus which are suitable for high volume commercial type production. Features of the present invention which assist in this respect are adhesive bonding techniques which allow almost instantaneous bonding of the vane material and apparatus which allow for material changes without complete re-setup.

Accordingly, a fabric light control window covering according to the present invention comprises a first sheer fabric sheet, a second sheer fabric sheet disposed parallel to the first sheet, and a plurality of relatively opaque fabric strips adhesively bonded transversely between the sheet fabrics. Each strip has an edge portion bonded to the first sheet and an opposite edge portion bonded to the second sheet in a manner tending to bias the first and second sheets together. The window covering according to the present invention is movable between a closed position and an open position. The closed position is characterized by a central portion of the fabric strips being substantially parallel to the first and second sheer fabric sheets with the strips themselves being substantially planar. The open position is characterized by the central portion of the fabric strips being substantially perpendicular to the first and second fabric sheets and to the bonded edge portions of the strips themselves. Also, characteristic of this position is that portions of the strips between the bonded edge portions and central portions form smoothly curving surfaces which are free of creases or sharp fold. In an alternative embodiment, the central portions of the fabric strips are substantially flat and longitudinally extending hinge or flex points are provided parallel to the bonded edge portions.

According to a preferred embodiment of the invention the method for manufacturing such a window covering generally includes the following steps. A first line of hot-melt adhesive is applied to the narrow strip material adjacent one edge on one side. A second line of hot-melt adhesive is applied to the narrow strip material adjacent the opposite edge on the opposite side. The narrow strip material is then cut to lengths equal to the width of the wider sheer fabrics and the cut lengths are separated to provide a space between them sufficient to allow for a subsequent processing step. The first sheer fabric is fed at a constant rate longitudinally in a direction perpendicular to the longitudinal direction of the cut strips. The first sheer fabric is also fed over the cut strips in close proximity thereto. As the first sheer fabric is fed, a portion is preheated to a temperature sufficient to form a tack bond with the hot-melt adhesive. Then, while continuously feeding the first sheer fabric at a constant rate, a portion of the first sheer fabric is stopped directly over one of the cut strips so that the cut strip may be pressed and bonded to the first sheer fabric without smearing the adhesive. In order to move the bonded strips out of the way of the next strip, the stopped portion of the first sheer fabric is advanced at a speed greater than the constant feed rate, followed by a reversing of the direction of travel of the formerly stopped portion to position the first sheer fabric for application of the next cut strip in an overlaying relationship to the previously applied cut strip. The second sheer fabric is then fed into mating contact with the cut strips which have been bonded to the first sheer fabric, thereby forming a sandwich of three layers. Almost immediately after feeding the second sheer fabric, the sandwich is heated under uniform pressure and tension to melt and force the hot-melt adhesive into the sheer fabrics, and set the layers of the sandwich at a uniform temperature-size relationship. Finally, the fabric sandwich is cooled under uniform pressure and tension, thereby permanently bonding the sheer fabrics to the cut strips without creating warps or wrinkles. The final, permanently bonded fabric can then be cut to desired lateral widths and/or trimmed along the lateral edges thereof.

Apparatus according to the invention generally comprises means for performing the above described method. In particular, the apparatus includes an adhesive applicator means comprising a heating block for melting the hot-melt adhesive. The heating block contains a gear pump which provides melted adhesive to nozzles at a rate proportional to the speed of feeding of the strip material. The heating block also is designed to melt only a small portion of adhesive in order to prevent yellowing while maintaining an adequate adhesive flow.

Included in the present invention is a means for positioning the first sheer fabric in order to stop a portion for application of a cut strip and then reposition and stop the fabric before the application of the next cut strip while maintaining a constant feed rate for the first sheer fabric. This portion of the apparatus comprises two dancer rollers around which the first sheer fabric runs. The dancer rollers are mounted on shafts which form the pivot points of a linkage around its frame. The linkage causes the dancer rollers to act in concert and the timing of the rotation of the linkage is controlled by an appropriately shaped cam member.

A heat setting means is provided in which the sandwiched layers of the window covering pass between first and second adjacent endless belts. The belts each run across hot and cool surfaces to successively heat and cool the window covering. In one embodiment, the hot and cool surfaces are rollers and tension induced in the belts causes a pressure to be exerted on the sandwiched layers, thus maintaining the layers under constant and uniform pressure at a tension significantly less than the tension induced in the endless belts. In another embodiment, the hot and cool surfaces are flat plates disposed opposite air plenums and the pressure exerted on the sandwiched layers is due to the biasing of the belts toward the flat plates by pressurized air supplied to the air plenums. Alternatively, the hot and cool surfaces may be pairs of oppositely disposed flat plates biased against the belts. Heat setting in these manners allows the sandwiched layers to be set to a uniform temperature and size relationship to prevent distortions in subsequent use.

Also, included in a preferred embodiment of the invention is a heat setting means wherein the first endless belt passes around a hot roller and the second endless belt passes around a cool roller. The location of the belts and rollers is arranged such that the second endless belt also passes around the hot roller outside of the first endless belt and the first endless belt passes around the cool roller for short distance outside of the second endless belt. With this arrangement the sandwiched layers of the window covering may be passed between the two belts, around the hot and cool rollers.

A hot knife cutting assembly is preferably provided to cut the final fabric to desired lateral widths and/or to trim the lateral edges of the final fabric. The hot knife cutting assembly operates such that the three layer sandwich fabric is cut cleanly, without any heat sealing of the lateral edges of the individual fabric layers to one another.

BRIEF DESCRIPTION OF THE DRAWING

The features and advantages of the present invention will be more readily apparent from the following detailed description of the preferred embodiments, illustrated in the drawing figures wherein:

FIG. 4 is an enlarged perspective view of the vane material of the present invention as viewed through line 4—4 in FIG. 1;

FIG. 5 is an enlarged perspective view of the sheer fabric with attached vane material at box 5 in FIG. 3;

FIG. 6 is a perspective end view of a fabric light control window covering according to the present invention;

FIG. 7 is a perspective end view of the window covering according to the present invention illustrating a possible method of deployment;

DETAILED DESCRIPTION OF THE PREFERRED EMBODIMENTS

Figure 1:
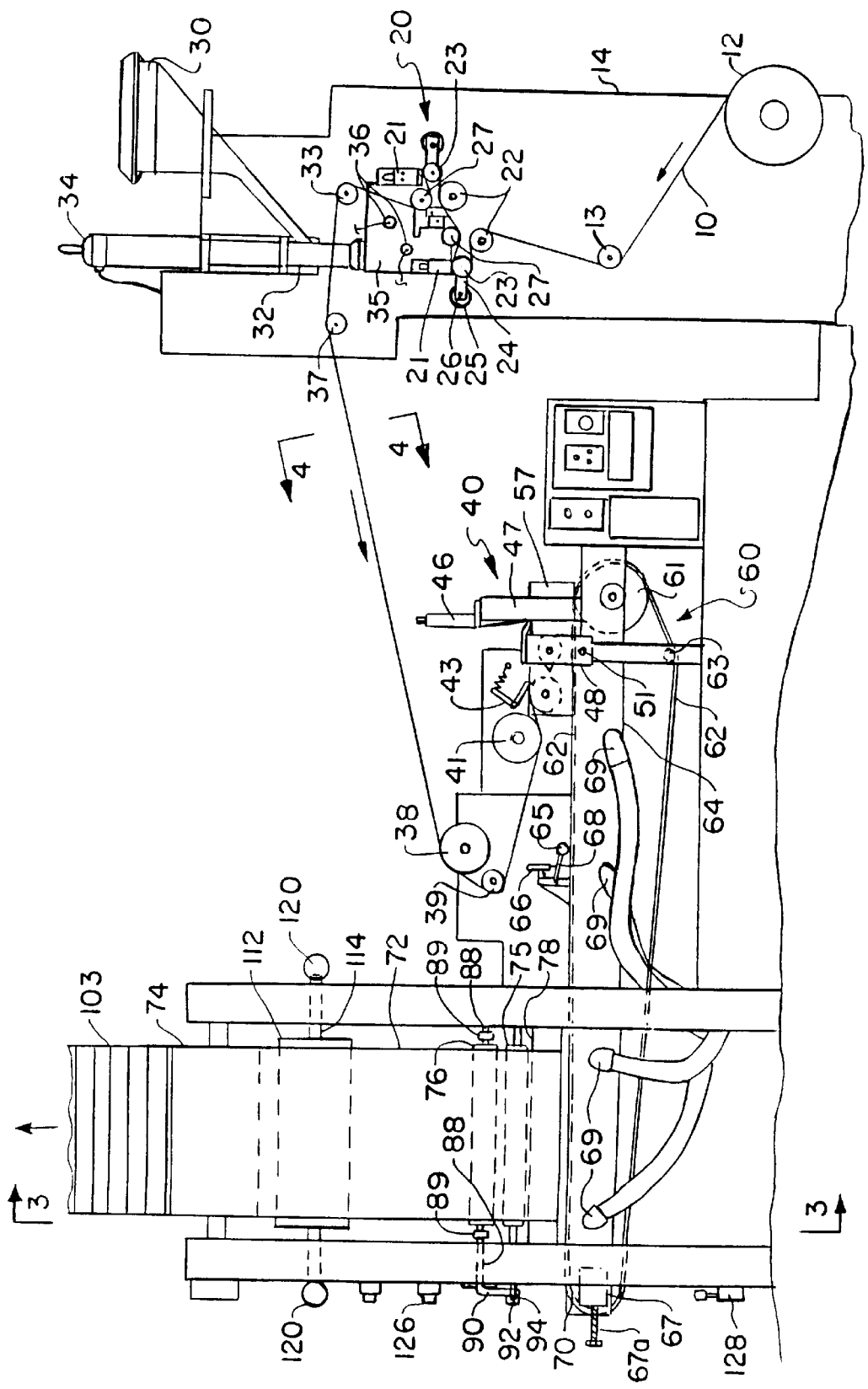
FIG. 1 is a front elevation view of a preferred embodiment of the apparatus according to the present invention.

Referring to the drawing and, in particular, first to FIG. 1, the method and apparatus according to the present invention may be explained in greater detail. Vane material is provided as a continuous strip material from supply roll 12. Vane material 10 first passes around idler roller 13 mounted on frame 14. The vane material then enters adhesive applicator assembly 20, where adhesive nozzles 21 apply a thin line 16 of hot-melt adhesive to each side of the vane material 10 (see FIG. 4). While the apparatus is explained below in connection with hot-melt adhesive, it should be readily appreciated that the same principles are generally applicable to other types of liquid adhesives.

In assembly 20 vane material 10 first passes around alignment roller 22 which is provided with raised edges in order to ensure proper alignment of the material. Vane material 10 next passes around backup roller 23 over which nozzle 21 is disposed. Backup roller 23 is mounted on arm 24 and shaft 26 which pivots in bearing 25 to allow for adjustment of the spacing between the glue nozzle 21 and vane material 10 on backup roller 23. Preferably, the spacing is adjusted to provide a flat glue line as shown in FIG. 4. The flat profile of the adhesive lines provides greater control of the amount of adhesive applied and the degree of flow when subsequently squeezed between two materials. With a two inch wide vane material 10, the dimensions of the adhesive lines are preferably about a height of 0.003 inches and a width of 0.060 inches.

Driven roller 27 is provided to assist in feeding the vane material and is positioned to ensure that vane material 10 has sufficient contact with backup roller 23. By passing vane material 10 under stationary nozzle 21, the adhesive lines are applied due to the linear motion of the vane material 10 in its longitudinal direction. In this manner great precision can be achieved in the application of the adhesive lines.

As illustrated in FIG. 4, adhesive line 16a is disposed on vane material 10 adjacent one edge and on one side of the material. A second adhesive line 16b is disposed adjacent the opposite edge on the opposite side of the material. The second adhesive line 16b is placed on vane material 10 by utilizing the same components as just described arranged in a mirror image configuration and by doubling vane material 10 back over itself around the second backup roller 23.

In a preferred embodiment of the present invention, the adhesive used is a copolyester hot-melt adhesive. This adhesive melts and flows at about 350° F. and provides excellent strength over the temperature range to which the window covering will be exposed in use. It also provides a tack bond at slightly lower temperatures around 220° F. which is useful in subsequent steps as described below.

This type of adhesive however does have the undesirable characteristic of yellowing when heated and maintained in a melted state for extended periods of time. In order to prevent yellowing, it is necessary to heat only a small amount of adhesive at a time. The present invention provides a novel system of adhesive application which eliminates this problem. Hot-melt adhesive in the form of pellets is placed in hopper 30. The pellets drop into caulking cartridge 32 which is provided with a pneumatic piston 34 that forces the pellets into heating block 35. Electric heating elements 36 heat heating block 35 to melt a small amount of adhesive just before it is forced into a metering gear pump which pumps the adhesive into nozzles 21. With this arrangement as little as four ounces of adhesive is melted at one time.

A gear pump, preferably a positive displacement pump, is disposed within heating block 35 to pump the melted adhesive to nozzles 21. The gear pump is powered proportionally to the vane material 10 feed speed such that the amount of glue deposited on the vane material 10 remains constant at whatever speed the vane material is fed.

After leaving the adhesive applicator assembly 20 vane material 10, with applied adhesive lines 16a, 16b, passes around idler rollers 33 and 37. The vane material then travels around alignment roller 38 which has raised edges to align the vane material and a further idler roller 39. Vane material 10 then travels into cutter assembly 40.

Figure 8:
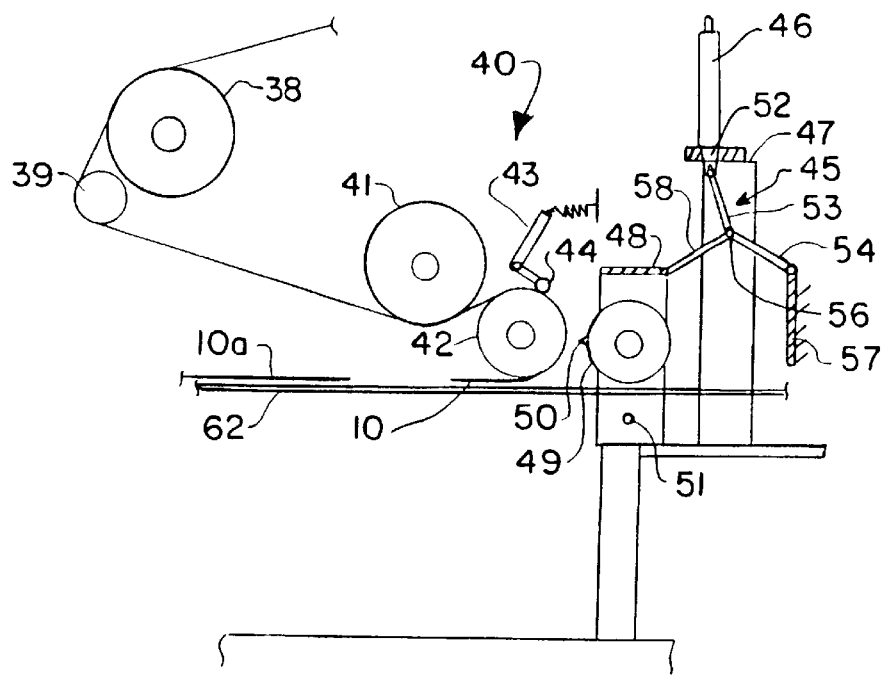
FIG. 8 is a diagrammatic illustration of a preferred embodiment of the cutting means of the present invention.

Cutter assembly 40 is shown schematically in greater detail in FIG. 8. In the cutter assembly, vane material 10 first passes around an alignment roller 41. Alignment roller 41 has raised edges similar to the other alignment rollers in order to guarantee the side-to-side alignment of vane material 10. The vane material then passes between backup roller 42 and nip roller 44. Nip roller 44 is mounted on a pivotable spring biased arm 43 in order to maintain a constant pressure against the backup roller 42 and prevent slippage of vane material 10. Backup roller 42 is also a driven roller which pulls the vane material through the apparatus. Adjacent to backup roller 42 is cutting roller 49. Blade 50 is disposed on the circumference of cutting roller 49 parallel to the roller axis. Cutting roller 49 and backup roller 42 are spaced apart a distance sufficient to prevent blade 50 from cutting vane material 10 on each rotation of the rollers.

Cutting roller 49 is rotatably mounted on bracket 48 which pivots on shaft 51. After the desired length of fabric is fed around backup roller 42, pneumatic cylinder 46, mounted on bracket 47 and acting through linkage 45, causes bracket 48 to pivot to the left so that blade 50 contacts and cuts material 10 to form individual vane strips 10a. Linkage 45 comprises a clevis 52 attached to the end of the cylinder piston. Three connecting rods 53, 54 and 58 are joined at pivot point 56 and are pivotably connected at clevis 52, cutter assembly frame 57 and bracket 48, respectively. The downward motion exerted by cylinder 46 causes pivot point 56 to move down and thus pivots bracket 48 to the left around shaft 51.

Pneumatic cylinder 46 is controlled by a pneumatic valve (not shown) cooperating with the backup roller shaft. After the number of rotations of backup roller 42 corresponding to the desired length of vane material 10, the pneumatic valve opens to actuate pneumatic cylinder 46 and thus move blade 50 to the cutting position. Backup roller 42 and cutting roller 49 are both driven rollers travelling at the same speed in order to prevent a scraping action of blade 50 along backup roller 42.

In an alternate embodiment, nip roller 44 and biased arm 43 are eliminated. Instead, cutting roller 49 is surrounded by a squishable rubber liner having an outer diameter slightly greater than the radial extension of blade 50 and contacting backup roller 42. The contact between the cutting roller rubber liner and backup roller 42 creates a nip for pulling fabric through the apparatus.

When air cylinder 46 causes bracket 48 to move slightly to the left to cut the vane material, the rubber liner is compressed against backup roller 42 to expose cutting blade 50 and thus cut vane material 10.

After vane material 10 passes around backup roller 42 it falls onto vacuum belt 62 which is part of vacuum separator assembly 60. In FIG. 8 vane material 10 is shown slightly above belt 62 in order to clearly distinguish the two parts, in practice material 10 is pulled against belt 62. Vacuum separator assembly 60 separates the cut strips 10a of vane material in order to provide a sufficient distance between the strips to allow time for subsequent processing steps performed on the individual strips 10a.

Figure 2:
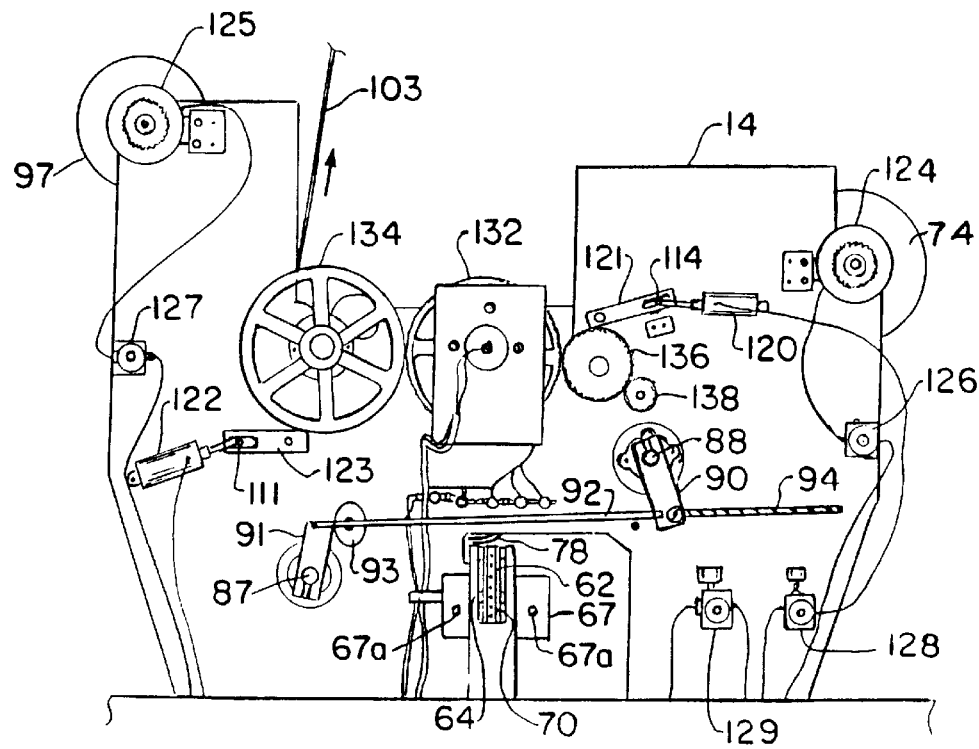
FIG. 2 is a left side elevation view of the apparatus shown in FIG. 1.
Figure 3:
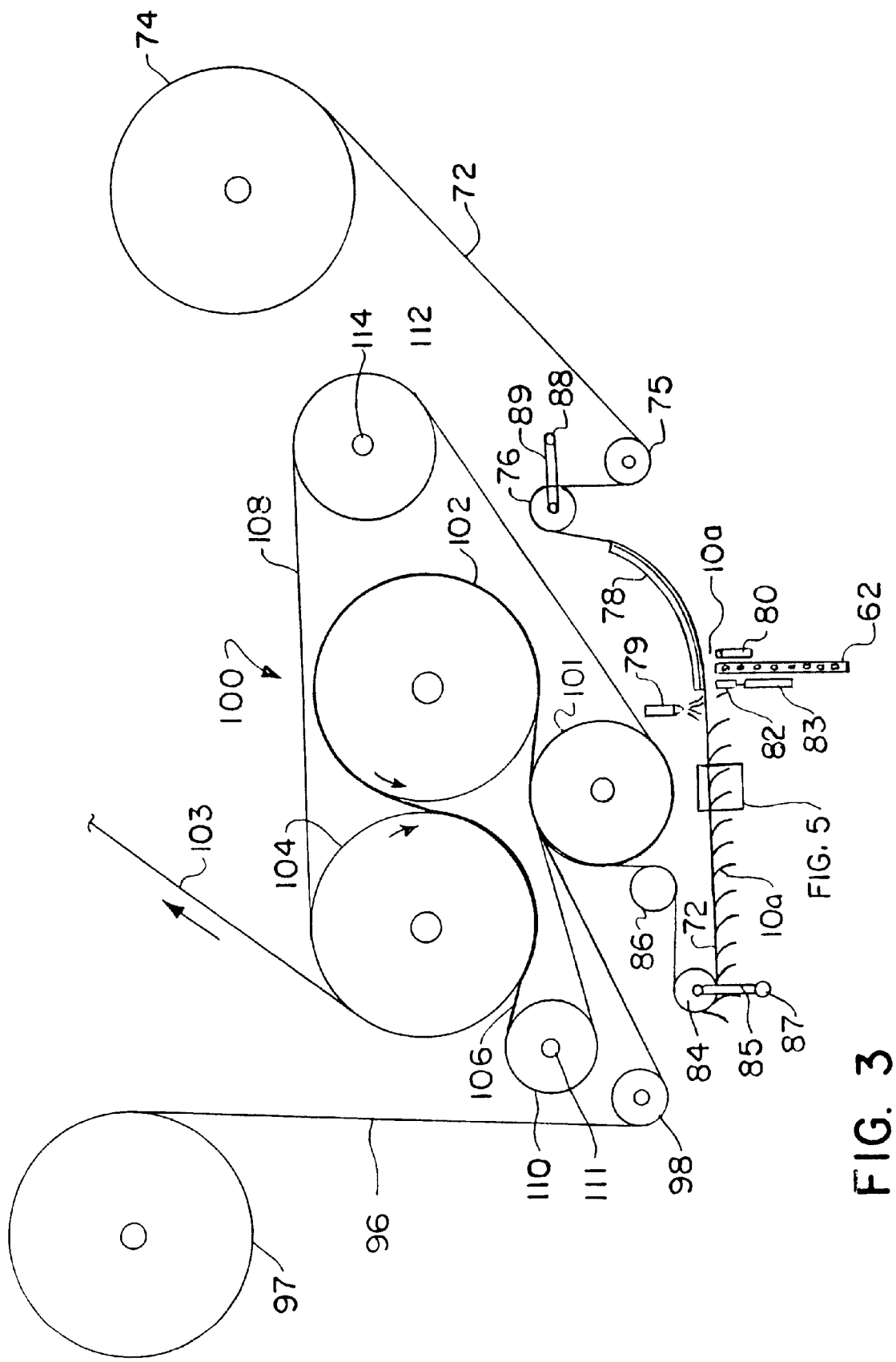
FIG. 3 is a diagrammatic view generally representing the apparatus as it would appear viewed through line 3—3 in FIG. 1.

Vacuum belt 62 is provided with holes which are best seen in FIGS. 2 and 3. Vacuum belt 62 travels around drive wheel 61, idler wheel 63 and idler wheel 70 which is mounted on screw tension adjustment 67. Screw tension adjustment 67 allows the tension in vacuum belt 62 to be adjusted by turning screws 67a. Vacuum belt 62 is supported along its top run 62a by hollow frame 64. The space within hollow frame 64 is evacuated by vacuum hoses 69, thus causing a suction through the holes of vacuum belt 62. This suction pulls the vane material against vacuum belt 62 as it comes off backup roller 42.

In order to provide the spacing between the cut strips 10a of vane material, vacuum belt 62 travels approximately twice as fast as the linear feed speed of vane material 10. Thus, as the uncut vane material 10 passes backup roller 42, it is pulled against vacuum belt 62 by the suction action. However, because it is moving at a slower speed, uncut vane material 10 slides along vacuum belt 62. As soon as vane material 10 is cut by blade 50, it is separated from the uncut vane material 10 due to the increased speed of the vacuum belt 62. Nip roller 65 presses against vacuum belt 62 and is located a distance from the point of contact between blade 50 and backup roller 42 slightly less than the desired length of individual cut strips 10a. Pneumatic cylinder 66 acts on arm 68 on which nip roller 65 is mounted in order to press nip roller 65 against vacuum belt 62. The actuation of air cylinder 65 is timed to correspond to that of pneumatic cylinder 46 such that at the precise moment vane material 10 is cut, nip roller 65 presses cut strip 10a against vacuum belt 62 to ensure its separation from the uncut vane material. Vacuum belt 62 moves the cut vane strips 10a to a position directly under first sheer fabric 72.

The cutting assembly 40 and separator assembly 60 allow for successful handling of relatively soft fabrics for the vanes 10a. This is a significant advantage over the prior art because soft fabrics provide a more pleasing appearance in the final product.

Referring to FIG. 3, first sheer fabric 72 is provided from supply roller 74 and fed around idler 75, dancer roller 76 and preheat shoe 78. The cut vane 10a is carried beneath a portion of first sheer fabric 72 which is resting against preheat shoe 78. Preheat shoe 78 heats first sheer fabric 72 to approximately 220° F.

First sheer fabric 72 is fed with its longitudinal direction perpendicular to the longitudinal direction of the vane 10a. The width of first sheer fabric 72 corresponds substantially to the cut length of vane 10a.

When vane 10a reaches alignment with the opposite edge of first sheer fabric 72, photo eye 80 senses the end of vane 10a and activates kicker bar 82. Kicker bar 82 is located on one side of vacuum belt 62 and directly below adhesive line 16a. Kicker bar 82 pushes the front edge of vane 10a upwards and presses adhesive line 16a between vane 10a and the preheated first sheer fabric 72. The combination of heat and pressure creates a tack bond between vane boa and first sheer fabric 72, thus holding vane 10a in place on first sheer fabric 72. Kicker bar 82 then retracts downwards and out of the way of the next vane. Kicker bar 82 is mounted on a number of pneumatic cylinders 83 which provide the pressing force and accomplish the tack bond cycle within a span of about one-tenth of a second. First sheer fabric 72 with tack bonded vanes 10a, as shown in FIG. 5, then moves around dancer roller 84 and idler roller 86 into heat setting assembly 100.

In the window covering according to the present invention it is preferred to have the vanes slightly overlapping in the closed position in order to fully block the passage of light. This overlap requirement somewhat complicates the production of the window covering in order to prevent the subsequently attached vane from being adhered to the previous vane instead of the sheer fabric. In the present invention, dancer rollers 76 and 84 continuously reposition first sheer fabric 72 to solve this problem. The sheer fabric in the present invention is fed at a continuous rate and pulled through the apparatus by the heat setting assembly 100. In order to facilitate understanding of the method and apparatus for positioning first sheer fabric 72, the description is made with reference to a two inch wide vane material 10. It should be readily appreciated that this is intended to in no way limit the present invention. Other vane material widths may be used with simple adjustments, apparent to those skilled in the art based on the disclosure contained herein.

With a two inch vane material, the overlap of the vanes is preferably about ¼ inch. Therefore, the first sheer fabric 72 is advanced a total of 1¾ inches for each vane 10*a* applied. In order to control and position first sheer fabric 72, the first sheer fabric 72 runs around dancer rollers 76 and 84. After a vane 10*a* has been applied, dancer roller 76 moves downward and dancer roller 84 moves to the left as shown in FIG. 3. This causes first sheer fabric 72 to be moved forward a total of 2¾ inches at a rate faster than that at which first sheer fabric 72 is actually being fed. The forward movement of 2¾ inches allows the tack bonded vane 10*a* to move completely out of the way of the next vane to be applied. From this point, first sheer fabric 72 is moved backward one inch by the dancer rollers in order to assume the proper position of a total of 1¾ inches advancement. This positions the first sheer fabric 72 in place for the next vane 10*a* to be applied.

As the backward motion occurs, air jets 79 blow a jet of air through first sheer fabric 72 on to applied vane 10*a* to force it out of the way of kicker bar 82. A number of air jets 79 may be positioned along the width of first sheer fabric 72 just after kicker bar 82. Air jets 79 may provide a continuing airflow or may be timed to blow only during the backward motion of the dancers.

In order to maintain first sheer fabric 72 in a stationary position while the next vane 10*a* is applied, dancer rollers 84 and 76 continue to move back slowly so as to exactly counter the effect of the forward pull of heat setting assembly 100. Thus, first sheer fabric 72 between dancer rollers 76 and 84 remains briefly stationary. This prevents adhesive line 16*a* from being smeared when vane 10*a* is applied to first sheer fabric 72 and also allows first sheer fabric 72 to become sufficiently preheated by remaining stationary on the preheat shoe 78. Once kicker bar 82 tack bonds the next vane 10*a* to first sheer fabric 72 the positioning process repeats.

In a preferred embodiment of the present invention a single motor drive system is utilized to power adhesive applicator assembly 20, cutter assembly 40, vacuum separator assembly 60 and heat setting assembly 100. Dancer rollers 84 and 76 are also powered by this drive system. Dancer roller 76 is mounted on arms 89 which in turn are mounted on shaft 88. Similarly, dancer roller 84 is mounted on arms 85 which in turn are mounted on shaft 87. Shafts 87 and 88 extend through frame 14 as shown in FIGS. 1 and 2. Shafts 87 and 88 are linked together by arms 90 and 91 and connecting rod 92 which, together with frame 14 form a linkage. Arm 91 rides on cam 93 which is rotated by a shaft linked to the single motor drive system. Arm 91 is maintained in contact with cam 93 by extension spring 94. Cam 93 is shaped to provide the motion of dancer rollers 76 and 84 just described.

As can be seen in FIG. 1, vacuum belt 62 extends beyond frame 14 at the left end of the apparatus. This allows for fast and easy changes of the vane material 10. When a new vane material is placed on a supply roller 12, its leading edge may be simply taped to the trailing edge of the last vane material. Then, when the cut strip containing the taped splice approaches first sheer fabric 72, kicker bar 82 and the sheer fabric feed may be temporarily deactivated to allow the spliced portion of vane material to exit at the left side of the apparatus. When clean cut strips 10*a* of vane material begin to exit at the left side, the sheer fabric feed and kicker bar 82 are reactivated. This allows quick changes of vane material without introducing flaws into the final product or requiring lengthy set up times.

Referring again to FIG. 3 the remaining steps of the process may be explained. First sheer fabric 72 which passes around idler roller 86 has vanes 10*a* tack bonded thereto in their final spaced relationship. Second sheer fabric 96 is fed from supply roller 97 around idler roller 98 and laid up against first sheer fabric 72 with tack bonded vanes 10*a*. The three-layer sandwich of first sheer fabric 72, vanes 10*a* and second sheer fabric 96 travels over idler 101, around heating roller 102 to cooling roller 104 and from there exits the apparatus as a finished fabric 103. Heating roller 102 is maintained at a temperature of approximately 350° F. At this temperature hot melt adhesive lines 16*a*, 16*b* are melted to form a permanent bond between the sheer fabrics 72, 96 and vanes 10*a*. Cooling roller 104 is maintained at a temperature of approximately 120° F. and sets the hot-melt adhesive bonds.

In addition to providing an almost instant bond of high strength, the heat setting assembly provides a second function of equal importance. By running the three layers together around heating roller 102 at a temperature of 350° F., the sheer fabrics and vane material are actually heat set to their new size and configuration at a uniform temperature-size relationship. The fabrics will thus hold this new size relationship with respect to one another unless subjected again to a temperature of 350° F. or greater. The temperatures which normally would be experienced by this type of window covering in use generally do not exceed a 180° F. Thus, the window covering according to the present invention will remain wrinkle-free at any normal use temperatures.

Additionally, the heat setting procedure allows for the use of fabrics which have not previously been heat set. Most fabrics are run through a heat setting process which sets the fibers and locks them to size in order to prevent shrinkage when subjected to heat in their normal applications. The heat setting apparatus of the present invention allows this preheat setting of individual fabrics to be eliminated, thus saving time and money in the fabric processing.

The present invention provides a further novel feature in order to ensure that a wrinkle-free final product emerges from heat setting assembly 100. This feature is the use of endless tension belts 106 and 108, respectively. First belt 106 travels around heating roller 102 and idler 110 mounted on shaft 111. Second belt 108 travels around cooling roller 104, idler 112, mounted on shaft 114, and idler 101. Second belt 108 also travels around heating roller 102 outside of first belt 106. Similarly, first belt 106 travels for a short distance around cooling roller 104 outside of second belt 108. The three-layer fabric sandwich is pressed between the first and second belts 106, 108 as it passes around heating and cooling rollers 102, 104. The first and second belts 106, 108 are maintained at a much greater tension than the sandwich of sheer fabrics 72, 96 and vanes 10*a* as it passes therebetween. The tension in the belts has the effect of pressing together the belts around heating and cooling rollers 102, 104. This uniformly presses the finished fabric 103 as it is heat set and cooled, thus further eliminating the possibility for a wrinkled or warped final product. In a preferred embodiment, first and second belts 106, 108 are polytetrafluoroethylene (TEFLON) coated fiberglass belts which have the required strength and exhibit the release characteristics of polytetrafluoroethylene.

Referring to FIG. 2, the tensioning of belts 106 and 108 is controlled by pneumatic cylinders 120 and 122, provided in pairs on both sides of frame 14. Pneumatic cylinders 120 act on shaft 114 which carries idler 112 and thus control the tension in cooling belt 108. Pneumatic cylinders 122 act on shaft 111 on which idler 110 is mounted and thus control the tension in heating belt 106. Both of cylinders 120 can be seen in FIG. 1. Slotted arms 121 and 123 ensure alignment of shafts 114 and 111, respectively. Air supply to the cylinders is controlled by regulators 128 and 129. The unwind tension of sheer fabric supply rollers 74 and 97 is controlled by pneumatic brakes 124 and 125, which are regulated by regulators 126 and 127, respectively. The pneumatic brakes and regulators allow the tension in the sheer fabrics to be precisely controlled during the steps of bonding the vanes and heat setting the layers together.

The rotation of heating and cooling rollers 102, 104 is linked together by geared wheels 132 and 134 which are in turn driven by gears 136 and 138 linked to the drive system. Heating roller 102 may be heated by electric heating elements disposed around the internal diameter of the roller which is preferably formed as a hollow aluminum cylinder. Cooling roller 104, also preferably formed as a hollow aluminum cylinder, may be cooled by forced air convection or in larger rollers by liquid cooling passages formed in the roller.

Figure 9:
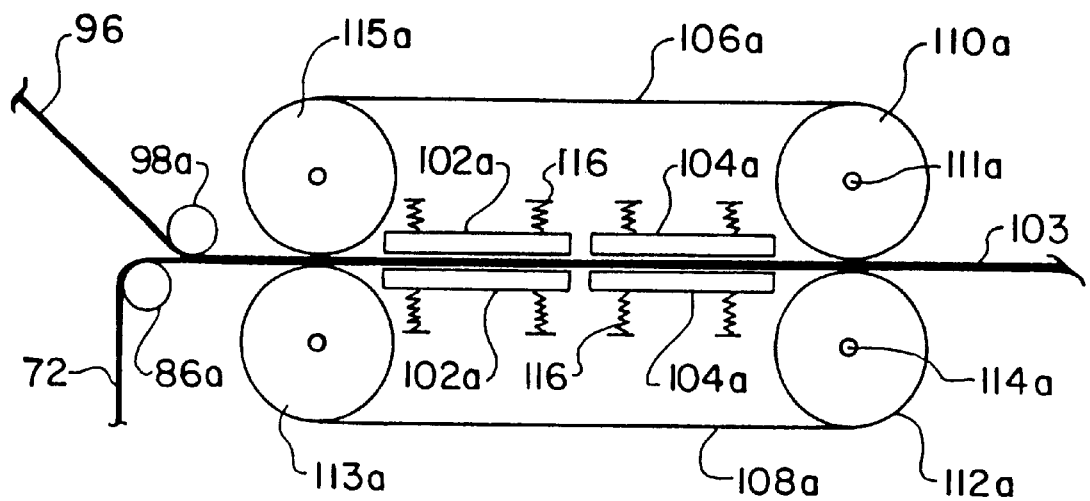
FIG. 9 is a diagrammatic illustration of an alternate embodiment of the heat setting apparatus according to the invention.
Figure 10:
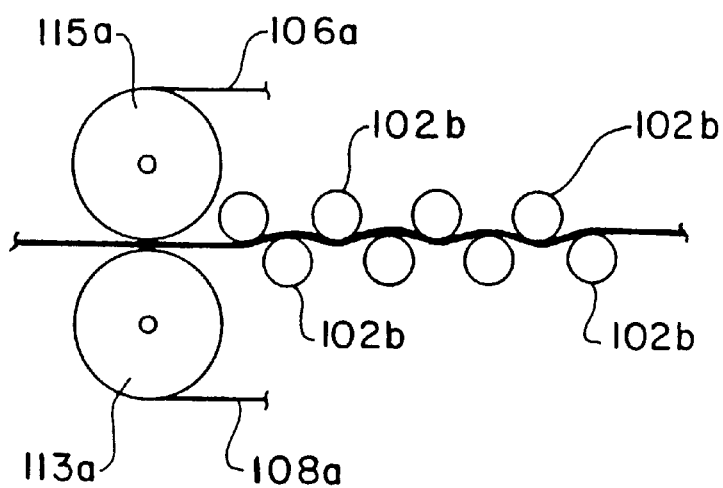
FIG. 10 is a diagrammatic illustration of a further alternate embodiment of the heat setting method and apparatus of the invention.
Figure 14:
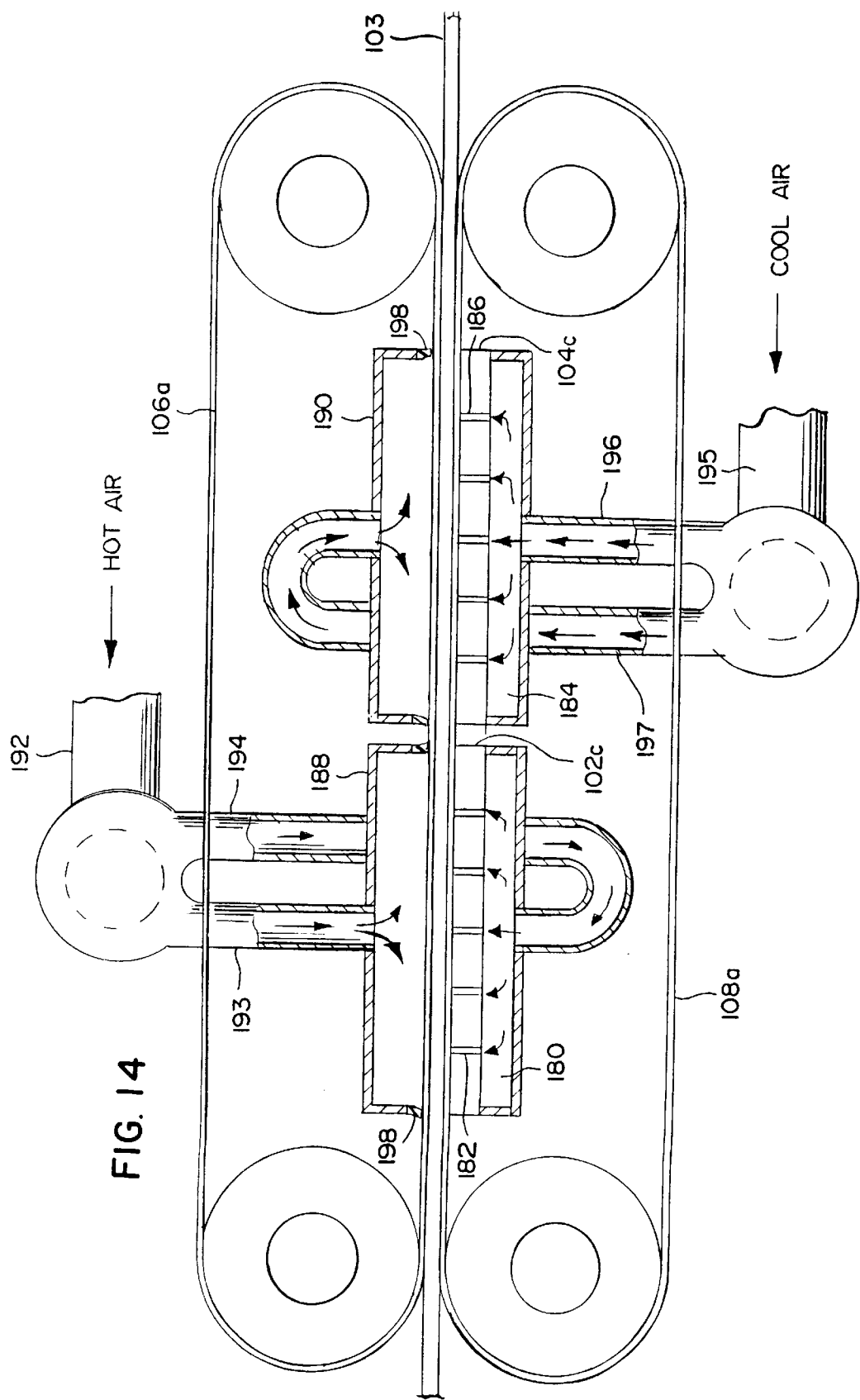
FIG. 14 is a diagrammatic, cross-sectional illustration of still another alternate embodiment of the heat setting method and apparatus of the invention.

FIGS. 9, 10 and 14 illustrate alternative embodiments of the heat setting apparatus according to the present invention. In FIG. 9, first and second belts 106*a* and 108*a* are carried by rollers 115*a* and 110*a* and rollers 113*a* and 114*a*, respectively. Tension in belts 106*a* and 108*a* may be adjusted by the moving shafts 111*a* and 114*a* in the same manner as shafts 111 and 114, explained above. Second sheer fabric 96 is again sandwiched with first sheer fabric 72 having tack bonded vanes 10*a*. The sandwiched layers then run between belts 106*a* and 108*a*. Heating is provided by hot plates 102*a* and cooling by cool plates 104*a* disposed inside each of the belts. The plates are biased against the belts and sandwiched layers by springs 116 to ensure a uniform pressure on the sandwiched layers.

In the embodiment of FIG. 10 belts 106*a* and 108*a* are arranged generally as shown in FIG. 9. However, instead of hot plates 102*a* a plurality of hot rollers 102*b* are employed. Hot rollers 102*b* are disposed inside each belt 106*a* with the axes of the upper set of rollers offset between the axes of the lower set of rollers. The axes of the upper and lower sets are also located slightly closer together than the diameter of the rollers thus providing a slight wrap of the belts around each roller. The wrap around each roller creates a uniform pressure on the sandwiched layers between belts 106*a* and 108*a* when tension is applied to the belts. In a preferred embodiment the rollers are positioned such that the belts wrap around an arc of approximately 20°. Rollers arranged in the same manner as hot rollers 102*b* may be used as cooling rollers or cooling plates 104*a* may be employed.

In the embodiment of FIG. 14, first and second belts 106*a* and 108*a* are arranged generally as shown in FIG. 9. However, instead of two hot plates 102*a* and two cool plates 104*a*, only one hot plate 102*c* and one cool plate 104*c* disposed within endless belt 108*a* are employed. The hot plate 102*c* includes an air chamber 180 and a plurality of air bleed holes 182 are formed through hot plate 102*c*. The air bleed holes 182 provide fluid communication through the hot plate 102*c* between the air chamber 180 and the upper surface of hot plate 102*c*. Similarly, cool plate 104*c* includes an air chamber 184 and a plurality of air bleed holes 186. Air plenums 188, 190 are disposed within endless belt 106*a* and are positioned opposite the hot plate 102*c* and the cool plate 104*c*, respectively. Each of the air plenums 188, 190 is provided with flexible seals 198 around the lower edge thereof adjacent endless belt 106*a*. Preferably, the hot plate 102*c* and the cool plate 104*c* are wider than the belts 106*a*, 108*a* and the air plenums 188, 190 are narrower than the plates and the belts.

Air is supplied to air plenum 188 and air chamber 180 of the hot plate 102*a* by hot air blower 192. More particularly, hot air blower 192 supplies air at a pressure of about 3 to 4 psi and a temperature of about 350 to 400° F. to air plenum 188 through conduit 193 and to air chamber 180 through conduit 194. Hot plate 102*c* is also heated to a temperature of about 350° by suitable means. Air is supplied to air plenum 190 and air chamber 184 of cool plate 104*c* by cool air blower 195. Air at a pressure of about 3 to 4 psi and ambient temperature is supplied by cool air blower 195 through conduit 196 to air chamber 184 and through conduit 197 to air plenum 190. Cool plate 104*c* is cooled to a temperature of about 120° F. or lower, by suitable means such as water cooling.

The air pressure in the air plenums 188, 190 pushes or biases the belts 106*a*, 108*a*, and the fabric sandwich 103 therebetween, toward the hot plate 102*c* and the cool plate 104*c*. In contrast to the embodiments of FIGS. 3, 9 and 10, in the embodiment of FIG. 14 the tension in the belts 106*a*, 108*a* is not critical. In this embodiment, the pressure applied to the fabric sandwich 103 between the belts 106*a*, 108*a* is created by air pressure instead of tension.

The 3 to 4 psi of air introduced into the air plenums 188, 190 pushes the belts 106*a*, 108*a* and the fabric sandwich 103 against the hot plate 102*c* and the cool plate 104*c*, respectively. This uniformly presses the finished fabric 103 as it is heat set and cooled. Pressurized air flowing through the air bleed holes provided in the hot plate 102*c* and the cool plate 104*c* lifts the belt 108*a* off the hot and cool plates, preferably a few thousandths of an inch, to minimize friction between the belt 108*a* and the plates to ensure uniform heating and cooling of the fabric sandwich 103.

Figure 11:
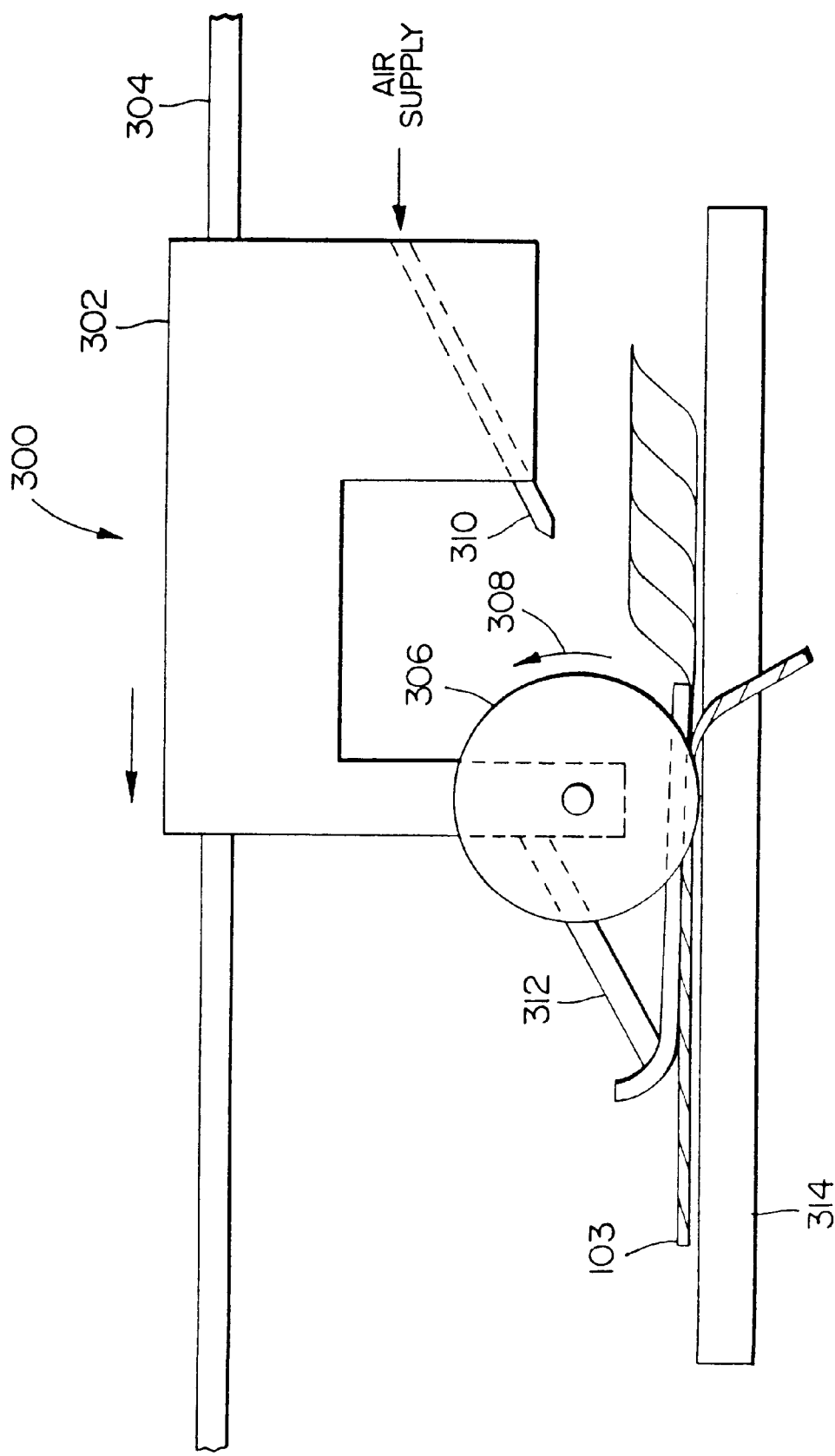
FIG. 11 is a side view of a hot knife cutting assembly according to the invention.

After the finished fabric 103 exits the apparatus as shown in FIG. 3, the finished fabric 103 can be wound up in a roll for storage and subsequent processing into a finished window covering, or the finished fabric 103 can be immediately transported to trim the lateral edges of the finished fabric 103 and/or to cut the finished fabric 103 into desired lateral widths. A suitable hot knife cutting assembly is shown in FIG. 11. The hot knife cutting assembly 300 comprises a moving carriage 302 slidably or movably mounted on carriage rails 304. A hot wheel knife cutter 306 is rotatably mounted on the moving carriage 302 and rotates in the direction indicated by arrow 308. A shoe 312 carried by the moving carriage 302 holds the finished fabric 103 flat on the table or support 314 until the fabric 103 is cut by the rotating hot wheel knife 306. Depending upon the material of the first sheer fabric, the second sheer fabric and vanes of the finished fabric 103, it may be possible to carefully control the temperature of the hot wheel knife 306 to prevent sealing of the lateral, cut edges of the three layers of the finished fabric 103 to one another due to the heat of the hot wheel knife 306. However, preferably, an air jet 310 connected to an air supply (not illustrated) is mounted on the moving carriage 302. Air supplied through the air jet 310 blows onto the edge of the cut fabric 103 immediately after the cutting, and air from the air jet 310 lifts and opens the lateral edges of the fabric 103 to prevent the edges of the fabric from sealing together. Instead of the air jet 310, other suitable means for lifting and opening the finished fabric 103 along the cut edge thereof may be carried by the moving carriage 302 to immediately effect opening of the finished fabric immediately after it is cut by the hot wheel knife 316. For example, mechanical opening means could be carried by the moving carriage to effect this opening.

The hot knife cutting assembly 300 may be employed to cut to the finished fabric 103 immediately after the finished fabric 103 has been produced, and prior to winding the finished fabric 103 into a roll for storage. Alternatively, the finished fabric 103 may be wound for storage and then, at a subsequent time or a different physical location, the finished fabric 103 from the storage roll can be cut using the hot knife cutting assembly 300.

FIGS. 6 and 7 illustrate a fabric light control window covering according to the present invention. FIG. 6 illustrates the window covering in a fully open, light admitting position. In this position, each vane 10a has a central portion 140 which is substantially perpendicular to first and second sheer fabrics 72, 96. Edge portions 142 of the vane 10a, which are bonded to the sheer fabrics are connected to central portion 140 by a portion 141 having a smoothly curving shape. The adhesive bonding process of the present invention allows portion 141 to be formed without creases or sharp folds. The smoothly curved nature of this portion, in the fully open position, allows the vane to retain its resiliency and thus tends to bias the sheer fabrics into a closed or drawn together position. This ensures that the window covering does not lose its shape over time from repeated opening and closing. Furthermore, creases along vanes 10a can develop into failure points due to repeated bending inherent in the opening and closing of the window covering.

FIG. 7 illustrates a possible method of deployment of a light control window covering according to the present invention. The window covering 150 is mounted on a head roller 152. The bottom of the first sheer fabric 72 may be provided with decorative stiffener 154. Second sheer fabric 96 is weighted by weight 153. Rotation of head roller 152 causes relative movement between first and second sheer fabrics 72, 96 in a vertical direction and thus an angular change in the orientation of vanes 10a to let in or block out light as desired. First sheer fabric 72 need not be weighted because of the tendency to close imparted by the biasing effect of vanes 10a.

FIGS. 6 and 7 also illustrate the novel technique employed in the present invention for avoiding the appearance of a moire effect in window coverings of this type. With such window coverings, sheer woven fabrics having small interstices between the fibers provide a pleasant and desirable appearance for the first and second sheer fabrics 72, 96. However, when the same or very similar material of this type is used for the first and second sheer fabrics, a moire pattern is created by the fabrics when viewed in overlaying relationship. This moire effect is eliminated in the present invention by providing first and second sheer woven or knit fabrics of materials having differently sized, shaped and/or oriented interstices. According to the present invention, the moire effect is also avoided by using a nonwoven sheer material as one or both of the first and second fabrics or by using a transparent plastic material as one or both of the first and second fabrics.

To avoid the undesirable moire effect when the first and second sheer fabrics of woven or knit material are viewed in overlaying relation in the window covering of the present invention, the first and second sheer fabrics must have different appearances when the sheer panels are viewed along an axis perpendicular to the plane of the first sheer fabric 72 and perpendicular to the plane of the second sheer fabric 96. The required difference in appearance between the first sheer fabric 72 and the second sheer fabric 96 can be achieved in several different ways.

The first sheer fabric 72 can be a woven or knit fabric having interstices of one shape and the second sheer fabric can be a woven or knit material having interstices of a second shape. In one such embodiment shown in FIG. 7, a woven fabric employing fibers forming small square interstices is used as the second sheer fabric 96. A material used for the first sheer fabric 72 may have fibers forming interstices which are smaller, the same size or larger than those of the second sheer fabric 96. However, the fibers of the first sheer fabric 72 form interstices which are positioned as diamonds with respect to the second sheer fabric 96. With this relationship between first and second sheer fabrics, the appearance of a moire pattern can be avoided.

In another embodiment, the first sheer fabric 72 can be a woven or knit fabric having interstices of one shape and size and the second sheer fabric 96 can be a woven or knit fabric having interstices of the same shape as the first sheer fabric but of a different size. In this second embodiment, shown in FIG. 6, the moire pattern may be avoided by providing a second sheer fabric 96 which has interstices which are smaller than those of first sheer fabric 72 without regard to the relative orientation or shape of the interstices. This also prevents the occurrence of interference leading to a moire effect. In practice, the first and second fabrics are selected so that the width of the interstices of the first fabric is far greater than the width of the interstices of the second fabric, thereby avoiding the moire effect.

It is also possible to use the same woven fabric for both the first and second sheer fabrics 72, 96, provided that the woven fabric is oriented differently in the two sheer fabrics 72, 96 in order to provide the required difference in appearance. For example, with reference to FIG. 7, the woven fabric of second sheer fabric 96 has square interstices. The same woven fabric having square interstices can be used as the woven fabric of the first sheer fabric 72 by changing the orientation of the woven fabric by 45° to provide the diamond shaped interstices of the first sheer fabric 72. When the same woven fabric is used for both the first and second sheer fabrics 72, 96, the fabric for one of the sheer fabrics is cut on the bias so that the orientation of the interstices of that fabric is changed by an angular amount, e.g. roughly 45° or 90°, sufficient to provide the required difference in appearance when the first and second sheer fabrics 72, 96 are viewed along an axis perpendicular to the plane of both.

It is also possible to avoid the moire effect and provide the required difference in appearance by using a nonwoven sheer material, such as a plastic material, for one of the sheer fabrics and a woven sheer material for the other of the sheer fabrics of the window covering. Alternatively, nonwoven sheer materials, such as the same or different plastic materials, can be used for both the first and second sheer fabrics. A transparent plastic material can also be used as the first and/or second fabric. The use of a transparent material as at least one of the first and second fabrics also avoids the moire effect.

In another embodiment of the present invention, the second sheer fabric 96 is replaced by a series of sheer fabric strips or a series of strings. A window covering of this embodiment can be made by the same process and apparatus as described above, however a series of parallel sheer fabric strip or parallel strings are fed to the apparatus from an appropriate supply roll instead of the second sheer fabric 96. The use of a series of strings or sheer fabric strips in place of the second sheer fabric 96 provides a more "see-through" effect when the window covering is in the open position. However, because the overlapping configuration of the vanes is the same as that of a window covering having a second sheer fabric 96, in the closed position a window covering comprising a plurality of strings or sheer fabric strips provides the same light blocking effect.

To achieve the gently curved structure of the vanes 10*a* shown in FIG. 6, the vane material must have a certain degree of softness. As a general principle, the wider the vanes 10*a*, the stiffer the vane material can be. However, since a broad range of vane widths may be employed in window coverings in accordance with the present invention, it is difficult to precisely define an acceptable softness or stiffness range for the vane material.

A simple and effective physical test has been devised to determine whether a particular fabric is suitable for vanes having a specific vane width. The fabric being tested is allowed to hang over the edge of a table such that the distance from the edge of the fabric to the table top equals the desired vane width. If this length of fabric hangs substantially vertically, then it has sufficient softness for a vane of that vane width. For example, if a fabric is being tested for use as a 2" wide vane, the edge of the fabric is extended 2" beyond the edge of the table. If the extended 2" of the fabric hangs substantially vertically from the table edge, it is suitable for use as a 2" wide vane material in the structure shown in FIG. 6. If the extended 2" of the fabric does not hang substantially vertically, the fabric is too stiff to produce 2" wide vanes having the gently curved appearance of FIG. 6.

Figure 12:
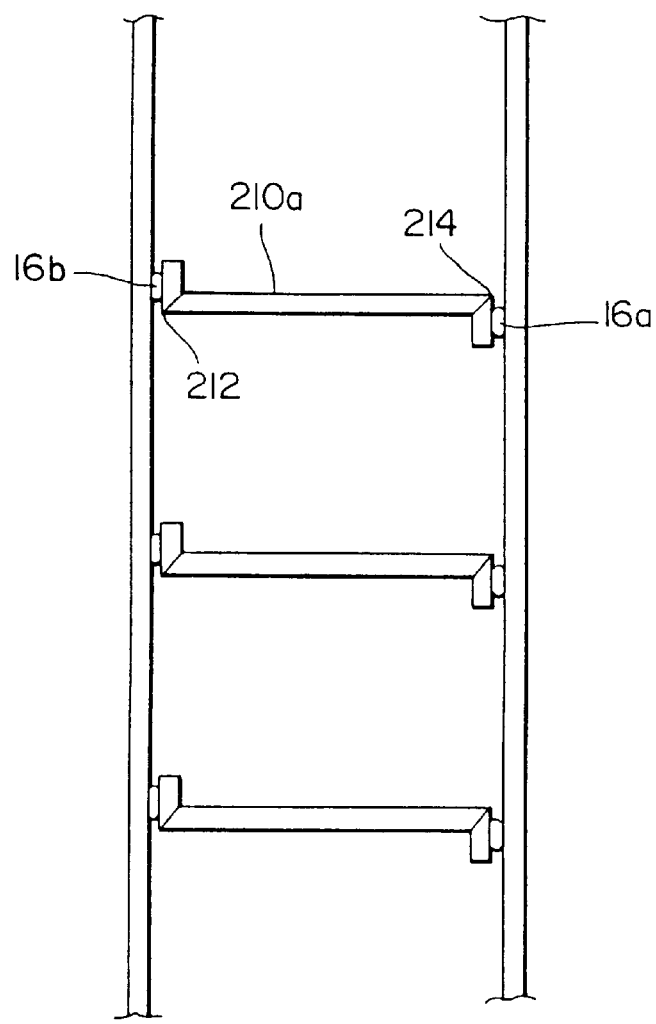
FIG. 12 is a side view of a second embodiment of a fabric light control window covering according to the present invention.
Figure 13:
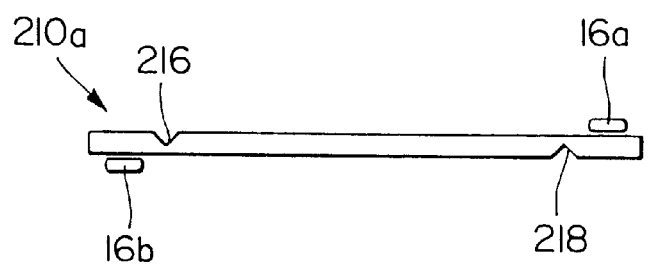
FIG. 13 is an end view of a vane material for the fabric light control window covering in FIG. 12.

Stiffer fabrics, i.e., those which do not hang substantially vertically over a table edge at the length of the desired vane width, can also be used as the vane material. However, if a stiffer fabric is used for the vanes, longitudinally extending hinge or flex points must be provided along the edges of the vanes. The use of a stiffer fabric provided with hinge points produces a window covering having a somewhat different appearance that the window covering shown in FIG. 6. This second embodiment of a window covering is shown in FIGS. 12 and 13. As seen in FIG. 12, vanes 210*a* have a straighter appearance and have a sharp bend at the hinge points 212 and 214, rather than a gently curving portion 141 as shown in FIG. 6. The hinge points 212, 214 are provided by score-compressing a stiff vane material, parallel to the longitudinal edges of the vane material. The score-compressed lines formed in the stiff vane material are spaced apart from the longitudinal edge of the vane material a distance sufficient to allow the adhesive lines 16*a*, 16*b* to be applied to the vane material between the longitudinal edge of the vane material and the score-compressed line.

A structure similar to that shown in FIG. 12 can also be produced using a relatively soft vane material, if desired. In this embodiment, a stiffening agent is printed onto the vane material in the central portion thereof to provide flatter vanes. The longitudinal edges of the vane material are left free of stiffening agent and the required hinge points are formed at the longitudinally extending edges of the printed on stiffening agent. The adhesive lines are applied to the longitudinal edges of the vane material, which longitudinal edges have been left free of stiffening agent.

According to another embodiment of the present invention, the vanes are formed of a black-out laminate material to maximize the room darkening effect of the window covering when the vanes are oriented in the closed position. A suitable black-out laminate material is a three ply laminate comprising a polyester film such as MYLAR sandwiched between two layers of a spun bonded or spun laced polyester nonwoven material. Black-out laminates of this type are generally known in the art and have previously been used in other types of window coverings. Such a three ply laminate has, by virtue of its construction, a greater stiffness than most single ply materials. Accordingly, score-compressed hinge points, such as those shown in FIG. 12, could be provided in the black-out laminate vane material if necessary.

Alternatively, to produce a window covering of the present invention having a maximized room darkening effect, only a stiffened central portion of the vanes is formed from a black-out laminate material. The longitudinal edges of the vanes are left free of the black-out laminate to provide the required hinge points and flexibility along the edges of the vanes. When the black-out laminate is provided only on the central portion of the vanes, it is desirable to space the vanes closer together than described above in order to ensure that the black-out laminated central portions overlap when the window covering is closed, for maximum room darkening effect. For example, for a 25 inch wide vane with a 1½ inch wide black-out laminated central portion, the overlap of the vanes is preferably about 1½ inch.

Another possible vane material is vinyl or a laminate of a nonwoven material and a vinyl material. Generally, vinyl materials and laminates of nonwoven material and a vinyl material provide an increased room darkening effect but are soft enough that score-compressed hinge points are not required. Of course, score-compressed hinge points could be provided if necessary.

As discussed with respect to the first and second sheer fabrics of the window covering, when two woven fabrics are viewed in an overlaying relationship, an interference pattern or moire effect can result. When a non-woven fabric is used for the vane material, the problem of a moire effect in the window covering when it is closed is avoided. In some instances, however, it may be desirable to use a woven or knit material for the vane material. A basic woven material will give a moire effect because this type of material has a very ordered orthogonal surface structure. To avoid a moire effect when the window covering having a woven or knit vane material is in the closed position, a crepe woven material can be used as the vane material because crepe woven materials have a much more randomly oriented surface structure. Alternatively, the surface of the woven or knit material can be altered to randomize the surface fibers, for example, by sanding, napping or calendarizing.

Window coverings having first and second sheer fabrics and vanes of various colors, and combinations of colors are contemplated within the scope of the present invention. For example, to provide a more transparent window covering in the open position, dark sheer material can be used for the first and second sheer fabrics because dark colors reflect less light than lighter colors. Similarly, white or light colored sheer materials provide a more translucent effect when the window covering is open.

The vanes may be the same color or a different color than the first and second sheer fabrics. A problem of glue line show-through has been experienced, however, when the vane material is a dark color and the first and second sheer fabrics are of a considerably lighter color or white. To overcome the problem of a dark glue line showing through a light colored sheer material when the vane is adhesively bonded to the first or second sheer fabric of the inventive window covering, a small amount of whitener, about 0.5 to 1.0% by weight, is added to the adhesive before it is applied to the vane material. A particularly suitable whitener is titanium dioxide. The addition of this whitening pigment to the adhesive eliminates the problem of dark colored glue lines being visible in a window covering wherein a dark colored vane is adhesively bonded to a lighter colored sheer fabric.

The description of the preferred embodiments contained herein is intended in no way to limit the scope of the invention. As will be apparent to a person skilled in the art, modifications and adaptations of the structure, method and apparatus of the above-described invention will become readily apparent without departure from the spirit and scope of the invention, the scope of which is defined in the appended claims.

What is claimed is:

1. A window covering comprising a first side comprised of a relatively translucent material, a second side comprised of a relatively translucent material and disposed substantially parallel to the first side, and a plurality of vanes extending between the sides, wherein the vanes are angularly controllable and change shape by relative movement of the first and second sides between a first position whereby the vanes are substantially planar and extend substantially parallel to the first and second sides, and a second open position whereby the vanes have smooth curving portions and are of generally S-shaped cross-sectional configuration.

2. The window covering according to claim 1 wherein the first and second sides are each formed of a single, continuous, unjointed piece of material.

3. The window covering according to claim 1 wherein at least one side comprises a plurality of strips joined together.

4. The window covering according to claim 3 wherein the plurality of strips are formed from the same material.

5. The window covering according to claim 1 wherein the relatively translucent material is cut from a roll of knit cloth.

6. The window covering according to claim 1 wherein at least one side comprises a sheer fabric.

7. The window covering according to claim 6 wherein each side comprises a sheer fabric.

8. The window covering according to claim 7 wherein the first side comprises the same sheer fabric as the second side.

9. The window covering according to claim 6 wherein the sheer fabric is knitted.

10. The window covering according to claim 1 wherein the first and second sides in the open position comprise substantially flat, straight, planar surfaces.

11. The window covering according to claim 1 further comprising a weight member and wherein the first and second sides each have edge portions, each side having at least one edge portion attached to the weight member.

12. The window covering according to claim 11 wherein the weight member comprises a bottom rail.

13. The window covering according to claim 6 further comprising a roller and wherein the first and second sides have edge portions, each side having at least one edge portion attached to the roller whereby rotation of the roller causes relative movement of the two sides.

14. The window covering according to claim 13 wherein the roller comprises a generally cylindrical tube.

15. The window covering according to claim 11 further comprising a generally cylindrical tube and wherein the edge portion of each side opposite the edge portion attached to the weight member is attached to the generally cylindrical tube.

16. The window covering according to claim 1 wherein the vanes comprise a material which is more opaque than the first or second side.

17. The window covering according to claim 7 wherein the vanes comprise semi-opaque material.

18. The window covering according to claim 17 wherein the vanes consist essentially of semi-opaque material.

19. The window covering according to claim 16 wherein the vane is formed of a non-woven material.

20. The window covering according to claim 1 wherein the vanes in the closed position effectively block the transmission of light through the window covering.

21. The window covering according to claim 20 wherein portions of adjacent vanes overlap in the closed position.

22. The window covering according to claim 16 wherein the vanes comprise relatively opaque material.

23. The window covering according to claim 22 wherein the vanes consist essentially of relatively opaque material.

24. The window covering according to claim 1 wherein the vanes comprise at least one strip of material which is different from the material comprising the first side.

25. The window covering according to claim 24 wherein the window covering is assembled using adhesive.

26. The window covering according to claim 1 wherein the vanes have opposite faces with one face of each vane attached to the first side and the other face of each vane attached to the second side.

27. The window covering according to claim 1 wherein the vanes are configured and adapted to bias the sides toward the first closed position.

28. The window covering according to claim 27 wherein the vanes comprise a relatively flexible material and are configured and adapted to bias the sides toward the first closed position.

29. The window covering according to claim 1 wherein the vanes comprise a relatively flexible material and have opposite faces with one face of each vane attached to one side and the other face of each vane attached to the other side, the vanes retaining their resiliency and being biased toward a flat, uncurved shape.

30. The window covering according to claim 1 further comprising a roller and wherein the first and second sides are each comprised of a sheer material and each side has at least one edge portion attached to the roller, and the vanes comprise a material which is more opaque than at least one of the sides, each vane having opposite faces with one face of each vane attached to one side and the opposite face of each vane attached to the other side.

31. The window covering according to claim 30 wherein the vanes in the closed position have central portions effective to block the transmission of light through the window covering.

32. The window covering according to claim 31 wherein the vanes in the open position have the ability to transmit light through the window covering.

33. The window covering according to claim 32 wherein the vanes are angularly controllable by rotation of the roller.

34. The window covering according to claim 33 wherein portions of adjacent vanes overlap in the closed position.

35. The window covering according to claim 34 wherein at least one side is comprised of a plurality of parallel sheer strips.

36. The window covering according to claim 34 wherein the vanes comprise a plurality of materials.

37. The window covering according to claim 36 wherein the vanes have longitudinal margins adjacent the sides which comprise a different material than the central portions.

38. The window covering according to claim 36 wherein at least one side is comprised of a plurality of parallel sheer strips.

39. The window covering according to claim 38 wherein the side forms a sheet of material.

40. A window covering comprising a first side comprised of relatively translucent material, a second side comprised of relatively translucent material and disposed substantially parallel to the first side, and a plurality of vanes extending between the sides, wherein the vanes are angularly controllable and are formed of relatively flexible material such that the vanes change cross-sectional shape upon relative movement of the first and second sides between a first closed position whereby the vanes are substantially planar and extend substantially parallel to the first and second sides and a second open position whereby the vanes have smoothly-curving portions and are of generally S-shaped cross-sectional configuration.

41. A window covering comprising a first side comprised of a relatively translucent material, a second side comprised of a relatively translucent material disposed substantially parallel to the first side, and a plurality of vanes extending between the first and second sides, the vanes being angularly controllable by relative movement of the sides between a first closed position whereby the vanes are substantially parallel to the sides and a second open position whereby the vanes extend generally transverse to the first and second sides, wherein the vanes are comprised of a relatively flexible material which changes shape upon relative movement of the sides from a substantially planar shape having a straight cross-section in the closed position to smoothly curving and having a generally S-shaped cross-section in the open position.

42. A window covering comprising a first side comprised of relatively translucent material, a second side comprised of relatively translucent material and disposed substantially parallel to the first side, and a plurality of vanes extending between the sides, the vanes being angularly controllable by relative movement of the first and second sides between a first closed position whereby the vanes are substantially planar and extend substantially parallel to the first and second sides and a second open position whereby the vanes extend generally transverse to the first and second sides, wherein each vane has opposite faces with one face of each vane attached to the first side and the other face of each vane attached to the second side, the vanes forming smoothly curving portions so that the vanes are of generally S-shaped cross-sectional configuration when the vanes are in the second open position.

43. A window covering comprising a first side comprised of a relatively translucent sheer material, a second side comprised of a relatively translucent sheer material and disposed substantially parallel to the first side, and a plurality of vanes extending between the sheer sides, the vanes being angularly controllable and change shape by relative movement of the sheer sides between a first closed position whereby the vanes are substantially planar and extend substantially parallel to the sheer sides effective to at least partially block transmission of light and a second open position whereby the vanes extend generally transversely to the sheer sides so as to allow the transmission of light between the vanes, wherein each vane has opposite faces with one face of each vane secured to the first sheer side and the other face of the vane secured to the other sheer side, the vanes forming smoothly curving portions so that the vanes are of generally S-shaped cross-sectional configuration when the vanes are in the second open position.

44. A window covering having a flexible fabric assembly comprising:
    a first side comprised of relatively translucent material;
    a second side comprised of relatively translucent material and disposed substantially parallel to said first side; and
    a plurality of vanes extending between the first and second sides, the sides of the window covering being movable between a first closed position whereby the vanes are substantially planar and extend substantially parallel to the first and second sides, and a second open po ition whereby the sides are moved apart and the vanes extend generally transverse tc the sides wherein the flexible fabric assembly is biased to the first closed position.

45. A window covering comprising:
    (1) a front panel comprised of a relatively translucent material;
    (2) a back panel comprised of a relatively translucent material, the back panel configured and adapted to be substantially parallel to the front panel; and
    (3) a plurality of vanes extending between the front and back panels and angularly controllable by relative movement of the front and back panels between a first closed position whereby the panels are generally together and the vanes are substantially planar and substantially parallel to the front and back panels, and a second position wherein the panels are generally spaced a distance apart and the vanes extend generally transverse to the panels,
    wherein the vanes are configured and adapted to bias the front and back panels together to the first closed position.

46. The window covering according to claim 45 wherein the vanes comprise a relatively flexible material such that the vanes change shape upon relative movement of the panels.

47. The window covering according to claim 46 wherein the vanes in the second open position have smoothly-curving portions so that the vanes are of generally S-shaped cross-sectional configuration.

48. The window covering according to claim 47 wherein the vanes are formed of a material which is more opaque than either the front or back panels.

49. The window covering according to claim 12 wherein the front panel is formed of a sheer fabric.

50. The window covering according to claim 49 wherein the back panel is formed of the same sheer fabric as the front panel.

51. The window covering according to claim 49 wherein the vane is formed of a non-woven fabric.

52. The window covering according to claim 49 wherein the vane comprises a plurality of materials.

53. The window covering according to claim 49 wherein at least one panel comprises a plurality of parallel strips.

54. An expandable cellular light control assembly comprised of a plurality of elongated cells for use in a window covering, the assembly having a front comprised of a relatively translucent material, a back comprised of a relatively translucent material and a plurality of vanes extending between the front and back, the assembly being formed such that the elongated cells are biased toward a collapsed position with the front, back and vanes being substantially parallel to each other and in overlapping relationship to form a generally flat sandwich of fabric.

55. The cellular light control assembly according to claim 54 wherein the assembly is formed using adhesive.

56. The cellular light control assembly according to claim 55 wherein the adhesive is a hot-melt adhesive.

57. The cellular light control assembly according to claim 55 wherein the front comprises a sheer fabric.

58. The cellular light control assembly according to claim 57 wherein the back comprises a sheer fabric.

59. The cellular light control assembly according to claim 58 wherein at least the front or back is knitted.

60. The cellular light control assembly according to claim 59 wherein at least the front or back comprises a plurality of parallel strips.

61. The cellular light control assembly according to claim 60 wherein the vanes are more opaque than the front or back.

62. The cellular light control assembly according to claim 61 wherein the vanes have smoothly-curving portions and a generally S-shaped cross-sectional configuration when the cells are in the expanded position.

63. The cellular light control assembly according to claim 62 wherein the vanes have opposite faces with one face of each vane attached to the front and the other face of each vane attached to the back.

64. The expandable light control assembly according to claim 63 wherein the vanes partially overlap when in the collapsed position.

65. The expandable light control assembly according to claim 64 wherein the assembly is effective to substantially block transmission of light through the assembly when the cells are in the collapsed position.

66. An expandable cellular light control fabric assembly for use in a window covering having a plurality of collapsible cells which control the transmission of light through the assembly, the assembly having a front generally flat planar panel comprised of a relatively translucent material, a back generally flat planar panel comprised of a relatively translucent material configured and adapted to substantially overlap and be substantially parallel to the front panel, and a plurality of vanes extending between the front and back panels, the shape of the cells being controllable by relative movement of the front and back panels between a collapsed position whereby the panels are generally together and the vanes are substantially planar and substantially parallel to the front and back panels and an expanded position whereby the panels are generally spaced a distance apart and the vanes extend generally transverse to the front and back panels and have smoothly-curving portions and a generally S-shaped cross-sectional configuration.

67. An expandable cellular light control fabric assembly for use in a window covering comprising:

a first side comprised of a relatively translucent sheer material;

a second side comprised of a relatively translucent sheer material configured and adapted to substantially overlap and be substantially parallel to the first side, at least one of the sides being formed of a plurality of substantially parallel sheer strips; and a plurality of vanes comprised of relatively opaque material and extending between the first and second sides, the vanes being angularly controllable and change shape by relative movement of the first and second sides between a closed position whereby the sides are generally together and the vanes are substantially planar and substantially parallel to the first and second sides so as to effectively block the transmission of light through the assembly and an open position whereby the sides are generally spaced a distance apart and the vanes extend generally transverse to the front and back panels to allow the transmission of light through the assembly, the vanes having opposite faces with one face of each vane attached to one side and the other face of each vane attached to the other side wherein in the open position the vanes have smoothly-curving portions and a generally S-shaped cross-sectional configuration.

68. An expandable cellular light control fabric assembly for use in a window covering, said assembly being comprised of a plurality of superimposed and interconnected cellular units with each unit comprising:

a first side of a relatively translucent material having a bottom edge portion, a second side of a relatively translucent material having a bottom edge portion, said second side being disposed substantially parallel to said first side, and a vane interconnecting said first and second sides along said bottom edge portions, said vanes assuming a generally S-shaped configuration in cross-section when said first and second sides are spaced from each other.

\* \* \* \* \*

UNITED STATES PATENT AND TRADEMARK OFFICE
CERTIFICATE OF CORRECTION

PATENT NO. : 6,112,797
DATED : September 5, 2000
INVENTOR(S) : Wendell B. Colson and Paul G. Swiszcz Page 1 of 1

It is certified that error appears in the above-identified patent and that said Letters Patent is hereby corrected as shown below:

Title page,
Item [54], delete "APPARATUS FOR FABRICATING" and insert after "COVERING" -- AND FABRIC ASSEMBLY FOR USE THEREIN --.

Signed and Sealed this

Twenty-third Day of October, 2001

Attest:

*Nicholas P. Godici*

NICHOLAS P. GODICI
Acting Director of the United States Patent and Trademark Office Attesting Officer